(12) United States Patent
Kravtchenko et al.

(10) Patent No.: US 6,262,442 B1
(45) Date of Patent: Jul. 17, 2001

(54) ZENER DIODE AND RC NETWORK COMBINATION SEMICONDUCTOR DEVICE FOR USE IN INTEGRATED CIRCUITS

(76) Inventors: Dmitri G. Kravtchenko, App. 88, Bl. 1136, Zelenograd 103460, Moscow (RU); Anatoly U. Paderin, App. 126, Bl. 1107 Zelenograd 103480, Moscow (RU)

( * ) Notice: Subject to any disclaimer, the term of this patent is extended or adjusted under 35 U.S.C. 154(b) by 0 days.

(21) Appl. No.: 09/303,714

(22) Filed: Apr. 30, 1999

(51) Int. Cl.[7] .................................................. H01L 29/00
(52) U.S. Cl. ....................... 257/106; 257/532; 257/533; 257/536; 257/537; 257/603
(58) Field of Search .................................. 257/106, 603, 257/532, 533, 536, 537

(56) References Cited

U.S. PATENT DOCUMENTS

| | | | |
|---|---|---|---|
| 4,853,759 | * | 8/1989 | Hague ....................................... 357/51 |
| 5,218,222 | * | 6/1993 | Roberts ................................... 257/362 |
| 5,227,012 | * | 7/1993 | Brandli et al. ......................... 156/643 |
| 5,241,213 | * | 8/1993 | Hull ........................................ 257/606 |
| 5,355,014 | * | 10/1994 | Rao et al. .............................. 257/533 |
| 5,668,384 | * | 9/1997 | Murakami ............................... 257/106 |
| 5,760,450 | * | 6/1998 | Hurkx et al. ........................... 257/379 |
| 5,770,886 | * | 6/1998 | Rao et al. .............................. 257/533 |

FOREIGN PATENT DOCUMENTS

| | | | | |
|---|---|---|---|---|
| 352058382 | * | 5/1977 | (JP) | ...................... 257/106 |
| 355036941 | * | 3/1980 | (JP) | ...................... 257/106 |
| 355068669 | * | 5/1980 | (JP) | ...................... 257/106 |
| 357045283 | * | 3/1982 | (JP) | ...................... 257/106 |
| 62-58868 | * | 3/1987 | (JP) | . |
| 401145874 | * | 6/1989 | (JP) | ...................... 257/106 |
| 404127574 | * | 4/1992 | (JP) | ...................... 257/106 |

* cited by examiner

*Primary Examiner*—William Mintel
(74) *Attorney, Agent, or Firm*—Weiss & Moy, P.C.; Jeffrey D. Moy

(57) ABSTRACT

An improved semiconductor device which includes a zener diode and RC network combination that share common semiconductor mask steps during the fabrication process. A common N+ layer serves to provide both the separate N+ cathode regions of the zener diode and the separate bottom electrode N+ region of the capacitor. A common metal layer serves to provide separate electrical contacts to the N+ cathode regions of the zener diode and also provides a separate top metal electrode for the capacitor. The capacitor dielectric is comprised of silicon nitride. A silicon dioxide/silicon nitride insulation layer is formed between the top metal electrode of the capacitor and a resistive layer typically made from tantalum nitride.

10 Claims, 2 Drawing Sheets

ZENER DIODE AND RC NETWORK COMBINATION SEMICONDUCTOR DEVICE FOR USE IN INTEGRATED CIRCUITS

CROSS-REFERENCE TO RELATED APPLICATIONS

This application is related to U.S. patent applications entitled Semiconductor Device And Method Of Forming A Semiconductor Structure To Provide Electrostatic Discharge Protection", filed on Apr. 30, 1999 and having a Ser. No. 09/303,715, and "RC-Networks In Semiconductor Devices And Method, Therefor", filed on Apr. 30, 1999 and having a Ser. No. of 09/303,713. which are filed concurrently with the present U.S. patent application. The present U.S. patent application and the related applications are assigned to the same assignee.

BACKGROUND OF THE INVENTION

1. Field of the Invention

This invention generally relates to semiconductor devices and integrated circuits and fabrication methods therefor, more specifically, this invention relates to an improved zener diode and RC network combination semiconductor device in an integrated circuit and a method for manufacturing such an improved zener diode and RC network combination semiconductor device which provides voltage reference for active and/or passive devices or circuits or any type of integrated circuit.

2. Description of the Related Art

In the prior art, various types of zener diodes and methods for manufacturing zener diodes have resulted in a compromise between accuracy of the voltage reference and complexity of the fabrication process. Buried zener diodes, i.e. the PN junction is below the surface of the substrate, as found for example in U.S. Pat. No. 5,241,213 "Buried Zener Diode Having Auxiliary Zener Junction Access Path". (Hull) proffers to have increased voltage reference accuracy, but certainly at the expense of added complexity.

Another example of a more rudimentary buried zener diode appears in U.S. Pat. No. 4,910,158 "Zener Diode Emulation And Method Of Forming The Same" (Anderson). The Anderson reference discloses a zener diode pair.

The prior art which also includes U.S. Pat. No. 4,853,759 (Haque), U.S. Pat. No. 5,355,014 (Rao et al.), U.S. Pat. No. 5,770,886 (Rao et al.), U.S. Pat. No. 5,218,222 (Roberts), U.S. Pat. No. 5,227,012 (Brandli et al.) and Japanese Document 58-868 (04/1987) H01L27/04, disclose prior configurations. However, none of these prior references disclose the combination of features of the combined semiconductor integrated circuit device of this invention and the fabrication method therefor.

Furthermore, none of the prior art seeks to leverage the advantages of providing a zener diode with an RC network in one integrated circuit using all front side electrical contacts. Therefore a need existed to optimize a semiconductor structure and fabrication technique for providing a zener diode in combination with an RC network in one integrated circuit combination without using the backside of the semiconductor substrate by using the top or front side of the semiconductor substrate to make electrical contact to all of the devices including the active zener diode device, the passive resistor device and the passive capacitor device. This would facilitate use of such a semiconductor structure in a "Flip-Chip" type package or a backside mounted (die bonding) configuration because all of the electrical contacts are made to just one (top or front) side of the semiconductor substrate.

BRIEF SUMMARY OF THE INVENTION

It is an object of the present invention to provide an improved semiconductor device comprising at least one zener diode and an RC network and a fabrication method therefor.

It is another object of the present invention to provide an improved semiconductor integrated circuit device comprising at least one zener diode and an RC network.

It is still another object of the present invention to provide an improved semiconductor integrated circuit device comprising at least one zener diode located within a semiconductor substrate and an RC network wherein all of those active and passive devices are electrically connected on a front or top side of the semiconductor substrate and a fabrication method therefor.

BRIEF DESCRIPTION OF THE PREFERRED EMBODIMENT

In accordance with one embodiment of the present invention, a semiconductor integrated circuit device is provided which comprises, in combination, a semiconductor substrate; at least one zener diode located in the semiconductor substrate; a capacitor having two electrodes including a semiconductor electrode located in the semiconductor substrate; one level of a metallization layer located on the semiconductor substrate and having one portion providing the other electrode of the two electrodes of the capacitor and at least one other portion providing electrical contact to one portion of the at least one zener diode; an insulating layer located on at least a portion of a top surface of the one level of a metallization layer; a layer of resistive material located on a top surface portion of the dielectric layer; and a second level of a metallization layer located on at least portions of a top surface of the layer of resistive material, the second level of a metallization layer providing a pair of spaced apart metal contacts to the layer of resistive material which together with the layer of resistive material comprises a resistor.

In accordance with another embodiment of the present invention, a method of forming a semiconductor integrated circuit device comprises the steps of providing a semiconductor substrate; forming at least one zener diode located in the semiconductor substrate; forming a capacitor having two electrodes including a semiconductor electrode located in the semiconductor substrate; forming one level of a metallization layer located on the semiconductor substrate and having one portion providing the other electrode of the two electrodes of the capacitor and at least one other portion providing electrical contact to one portion of the at least one zener diode; forming an insulating layer located on at least a portion of a top surface of the one level of a metallization layer; forming a layer of resistive material located on a top surface portion of the dielectric layer; and forming a second level of a metallization layer located on at least portions of a top surface of the layer of resistive material, the second level of a metallization layer providing a pair of spaced apart metal contacts to the layer of resistive material which together with the layer of resistive material comprises a resistor.

The foregoing and other objects, features, and advantages of the invention will be apparent from the following, more particular, description of the preferred embodiments of the invention, as illustrated in the accompanying drawings.

DETAILED DESCRIPTION OF THE INVENTION

Figure 1:
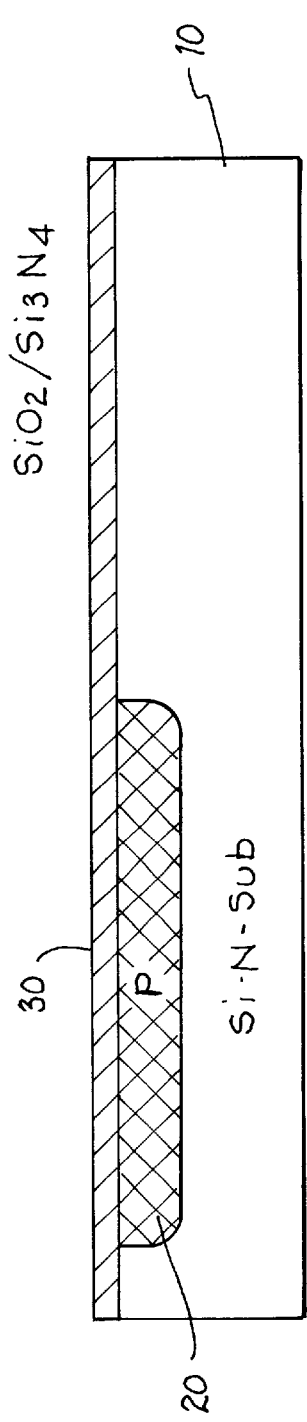
FIG. 1 is a cross sectional side elevation view of the semiconductor structure of the present invention in an early stage of the fabrication process depicting a P well anode in an N type substrate and a silicon dioxide/silicon nitride layer located on a surface thereof.

Referring to FIG. 1, a relatively early phase in the fabrication process of forming the semiconductor device of the present invention is shown. The starting N type silicon substrate 10 contains N type impurities such as arsenic, phosphorous, etc. The substrate 10 is doped to a desired level to provide optimum electrical characteristics for a starting N type substrate. While the specific embodiment shown is directed to certain types of semiconductor regions, it should be understood that the regions can, if desired, be reversed to provide a completed semiconductor device with opposite conductivity type regions from that shown in the drawings.

Initially a P type well anode 20 is diffused or implanted into the N type substrate 10 using photolithographic masking and etching techniques to form an opening in a layer of photoresist (not shown) which was deposited before the diffusion or implantation step of the P type well anode 20. One significant disadvantage with prior art devices is the use of relatively costly epitaxial regions which has been avoided in the fabrication process of this invention. The P type well anode 20 contains P type impurities such as boron. The P type well anode 20 is doped to a desired level to provide optimum electrical characteristics for a P type well.

Subsequently, a dielectric layer 30 comprised of a layer of deposited or thermally grown silicon dioxide and followed by a subsequent deposited layer of silicon nitride is formed on the surface of the P type well 20.

Figure 2:
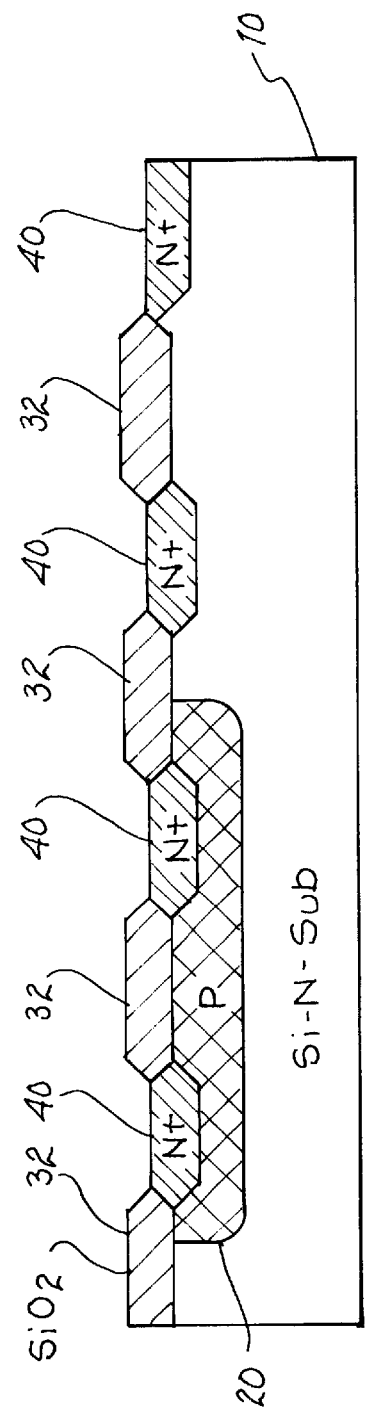
FIG. 2 is a cross sectional side elevation view of a later stage in the fabrication process in forming the semiconductor structure of the present invention showing a subsequent addition of relatively thick silicon dioxide isolation regions and apertures therein which permit the formation of spaced apart N+ type regions as shown in FIG. 2.

Referring to FIG. 2, which depicts a later phase in the fabrication process of the semiconductor device of the present invention, the formation of the cathode portions (N+) of the zener diodes are shown as well as the formation of other N+ regions to be used as described below. Standard semiconductor photolithography, i.e. masking and etching using photoresist (not shown), is used to create a plurality of apertures (not shown) in the dielectric or insulating layer 30 (see FIG. 1) which openings are spaced apart to permit the formation of the shown four spaced apart N+ regions and the shown three spaced apart, relatively thick silicon dioxide regions.

Subsequently, by means of the LOCOS technique (locally oxidized isolation regions) three relatively thick field oxide regions 32 are formed and by ion implantation or diffusion techniques using a heavily doped N type impurity, a plurality of N+type regions 40 (four regions are shown). Two N+ type regions are created and spaced apart in the P type well anode 20. Two N+ type regions are created and spaced apart in the N type substrate 10. The two spaced apart N+ type regions 40 formed in the P type well anode 20 are for the zener diodes the completed device. Each of the N+ type regions 40 is isolated from one another by the relatively thick field oxide regions or islands 32. Thus, back-to-back zener diodes are created by the formation of two N+ type cathode regions 40 in or on top of the P type well anode 20.

Figure 3:
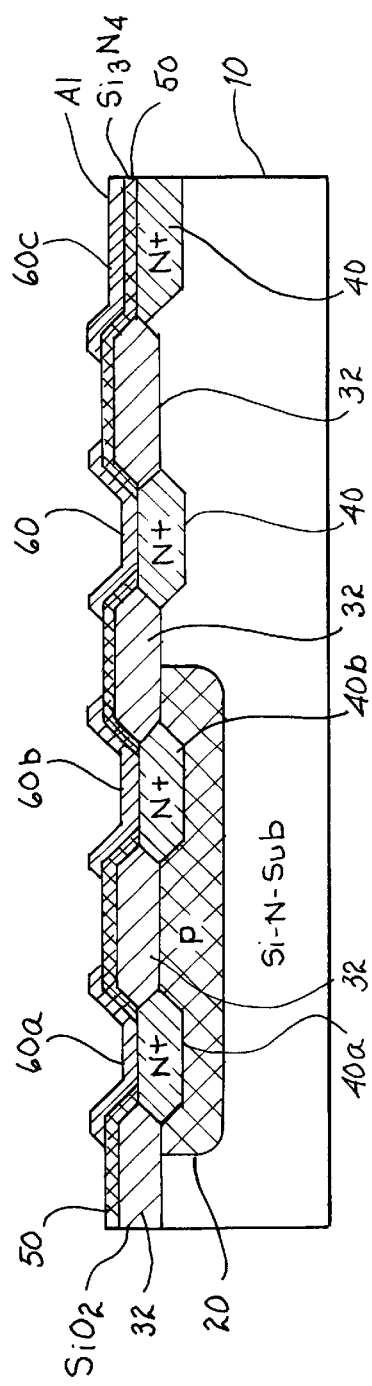
FIG. 3 is a cross sectional side elevation view of a still later stage in the fabrication process in forming the semiconductor structure of the present invention after a silicon nitride layer is deposited and openings formed therein to permit electrical contacts to be made to selected N+ type regions by depositing a first metal layer on the silicon nitride layer and the patterning thereof.

Referring to FIG. 3, which illustrates a subsequent phase in the fabrication process of the semiconductor device of the present invention, the metal contacts to the zener diodes and the initial steps in the fabrication of the RC network are shown. Initially, in this phase, a silicon nitride layer 50 is deposited on the top surface of the semiconductor structure of FIG. 2. Subsequently, again using standard semiconductor photolithography, i.e. masking and etching using photoresist (not shown), a plurality of apertures in the silicon nitride layer 50 are formed directly over N+ type regions 40a and 40b which regions provide the cathodes of the zener diodes and directly over the N+ region in the N substrate 10 to the right of the N+ region 40b.

Following this step, a first metal layer 60, preferably made of aluminum or aluminum alloy such as aluminum copper, is deposited over the device. Once again, using photoresist and etching techniques, portions of the metal layer 60 are removed to provide electrical isolation of various parts of the device. Metal portion 60a forms an ohmic contact with the N+ type region cathode 40a of the zener diode comprising P type well anode 20 and N+ type region cathode 40a. Metal portion 60b forms an ohmic contact with the N+ type region cathode 40b of the zener diode comprising P type well anode 20 and N+ type region cathode 40b.

Furthermore, metal portion 60c of the first metal layer provides electrical ohmic contact to the bottom semiconductor plate or electrode of a capacitor device by means of making electrical connection directly to the N+ region 40 (closest to the N+ region 40b), which is in contact with the N substrate 10 which is in electrical contact with the N+ region 40 under the silicon nitride layer portion 50. Therefore the same first metal layer which forms the contacts for the N+ regions 40a and 40b of the zener diodes also forms a conductive metal electrode 60c of the capacitor of the RC network with the N+ region 40 opposite the silicon nitride layer portion 50.

Figure 4:
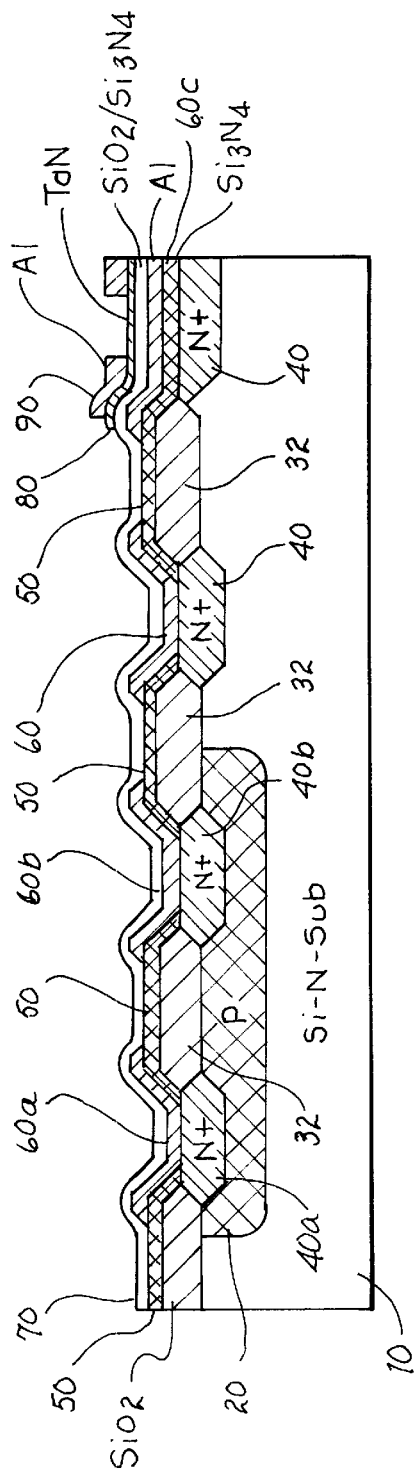
FIG. 4 is a cross sectional side elevation view of the completed semiconductor integrated circuit device of the present invention showing the addition of an insulating layer on the first metal layer, a resistive layer on a portion of the insulating layer and a second metal layer located on the resistive layer and patterned to provide spaced apart electrical contacts to the resistive layer.

Referring to FIG. 4, the final phase of the fabrication process and the completed semiconductor integrated circuit device is shown for the semiconductor device of the present invention in which the RC network is completed. A silicon dioxide layer is deposited followed by depositing a silicon nitride layer to provide a dielectric or insulating layer 70 on the top surface of the device. The dielectric layer 70 serves to insulate the aluminum electrode 60c of the capacitor from the still to be formed resistor.

Following the formation of the dielectric layer 70, a resistive layer 80, preferably made of tantalum nitride, is deposited over the top surface of the device. Most of the resistive layer 80 is etched away, except for that portion on the portion of the dielectric layer 70 that is located on the capacitor electrode metal portion 60c.

Finally, a second metal layer 90, again preferably made of aluminum or an aluminum alloy such as aluminum copper, is deposited over the device. Most of the second metal layer 90 is also etched away, except for the two spaced apart portions over the tantalum nitride resistor material 80 which provide electrical contacts thereto, and thereby form two contacts using the tantalum nitride material as the resistor.

Although the invention has been particularly shown and described with reference to a preferred embodiment thereof, it will be understood by those skilled in the art that changes in form and detail may be made therein without departing from the spirit and scope of the invention.

What is claimed is:

1. A semiconductor integrated circuit device comprising, in combination:

a semiconductor substrate;

at least one zener diode located in the semiconductor substrate;

a capacitor having two electrodes including a semiconductor electrode located in the semiconductor substrate;

one level of a metallization layer located on the semiconductor substrate and having one portion providing the other electrode of the two electrodes of the capacitor and at least one other portion providing electrical contact to one portion of the at least one zener diode;

an insulating layer located on at least a portion of a top surface of the one level of a metallization layer;

a layer of resistive material located on a top surface portion of a dielectric layer; and a second level of a metallization layer located on at least portions of a top surface of the layer of resistive material, the second level of a metallization layer providing a pair of spaced apart metal contacts to the layer of resistive material which together with the layer of resistive material comprises a resistor.

2. The device in accordance with claim 1 wherein the at least one zener diode comprising at least one N+ type region, the semiconductor substrate having a P region located therein, the at least one N+ type region located in the P region.

3. The device in accordance with claim 2 wherein the semiconductor substrate is an N type semiconductor substrate, the P region being located within the N type semiconductor substrate.

4. The device in accordance with claim 3 including an N+ type region located in a surface portion of the N type semiconductor substrate, a portion of the one level of a metallization layer in electrical ohmic contact with the N+ region located in the surface portion of the N type semiconductor substrate, the N type semiconductor substrate together with the N+ type region located in the surface portion of the N type semiconductor substrate and the portion of the one level of a metallization layer in electrical ohmic contact thereto comprising a portion of the semiconductor electrode of the capacitor.

5. The device in accordance with claim 4 including another N+ region located in another surface portion of the N type semiconductor substrate, a layer of dielectric material located between the another N+ region and the one portion of the one level of a metallization layer providing the other electrode of the capacitor, the another N+ region together with the N type semiconductor substrate, the N+ region located in the surface portion of the N type semiconductor substrate and the portion of the one level of a metallization layer in electrical ohmic contact with the N+ region located in the surface portion of the N type semiconductor substrate comprising the semiconductor electrode of the capacitor and an electrical contact thereto.

6. The device in accordance with claim 5 wherein the dielectric material is silicon nitride.

7. The device in accordance with claim 2 wherein two N+ type regions, each spaced apart from the other, are located in the P region.

8. The device in accordance with claim 1 wherein the layer of resistive material is tantalum nitride.

9. The device in accordance with claim 7 wherein both the one level of a metallization layer and the second level of a metallization layer comprises aluminum.

10. The device in accordance with claim 1:

wherein the semiconductor substrate is an N type semiconductor substrate, the P region being located within the N type semiconductor substrate;

including an N+ type region located in a surface portion of the N type semiconductor substrate, a portion of the one level of a metallization layer in electrical ohmic contact with the N+ region located in the surface portion of the N type semiconductor substrate, the N type semiconductor substrate together with the N+ type region located in the surface portion of the N type semiconductor substrate and the portion of the one level of a metallization layer in electrical ohmic contact thereto comprising a portion of the semiconductor electrode of the capacitor;

including another N+ region located in another surface portion of the N type semiconductor substrate, a layer of dielectric material located between the another N+ region and the one portion of the one level of a metallization layer providing the other electrode of the capacitor, the another N+ region together with the N type semiconductor substrate, the N+ region located in the surface portion of the N type semiconductor substrate and the portion of the one level of a metallization layer in electrical ohmic contact with the N+ region located in the surface portion of the N type semiconductor substrate comprising the semiconductor electrode of the capacitor and an electrical contact thereto;

wherein the dielectric material is silicon nitride;

wherein two N+ type regions, each spaced apart from the other, are located in the P region;

wherein the layer of resistive material is tantalum nitride; and wherein both the one level of a metallization layer and the second level of a metallization layer comprises aluminum.

* * * * *